United States Patent
Rai et al.

(10) Patent No.: US 7,859,913 B2
(45) Date of Patent: Dec. 28, 2010

(54) SEMICONDUCTOR MEMORY DEVICE

(75) Inventors: Toshiki Rai, Ogaki (JP); Sadao Yoshikawa, Yohroh-gun (JP)

(73) Assignees: Sanyo Electric Co., Ltd., Osaka (JP); Sanyo Semiconductor Co., Ltd, Gunma (JP)

( * ) Notice: Subject to any disclaimer, the term of this patent is extended or adjusted under 35 U.S.C. 154(b) by 77 days.

(21) Appl. No.: 12/485,566

(22) Filed: Jun. 16, 2009

(65) Prior Publication Data

US 2009/0310426 A1    Dec. 17, 2009

(30) Foreign Application Priority Data

Jun. 17, 2008   (JP) ............... 2008-157492

(51) Int. Cl.
*G11C 16/14*    (2006.01)
(52) U.S. Cl. ............... 365/185.29; 365/185.23
(58) Field of Classification Search ............... None
See application file for complete search history.

(56) References Cited

U.S. PATENT DOCUMENTS

| | | | |
|---|---|---|---|
| 5,029,130 A | 7/1991 | Yeh | |
| 5,045,488 A | 9/1991 | Yeh | |
| 5,067,108 A | 11/1991 | Jenq | |
| 5,265,052 A * | 11/1993 | D'Arrigo et al. | 365/185.23 |
| 5,787,037 A * | 7/1998 | Amanai | 365/185.18 |
| 6,201,747 B1 * | 3/2001 | Venkatesh et al. | 365/201 |
| 7,016,233 B2 * | 3/2006 | Kuo | 365/185.23 |

FOREIGN PATENT DOCUMENTS

| | | |
|---|---|---|
| JP | 11-274329 | 10/1999 |
| JP | 2000-173278 A | 6/2000 |
| JP | 2005-159336 A | 6/2005 |

* cited by examiner

*Primary Examiner*—Tan T. Nguyen
(74) *Attorney, Agent, or Firm*—Morrison & Foerster LLP

(57) ABSTRACT

There is offered a semiconductor memory device that has reduced number of high withstand voltage transistors so as to suppress an increase in a die size. A second transistor of N channel type is connected between a word line and a decoder circuit. A control signal from a control circuit is applied to a gate of the second transistor. When an output of the decoder circuit is at a low level, the word line is in a non-selected state, and a high voltage from a switching circuit is not outputted to the word line. Instead, the word line is provided with the ground voltage (=non-erasing voltage) from the decoder circuit through the second transistor.

4 Claims, 4 Drawing Sheets

REFERENCE EXAMPLE

REFERENCE EXAMPLE

US 7,859,913 B2

SEMICONDUCTOR MEMORY DEVICE

CROSS-REFERENCE OF THE INVENTION

This application claims priority from Japanese Patent Application No. 2008-157492, the content of which is incorporated herein by reference in its entirety.

BACKGROUND OF THE INVENTION

1. Field of the Invention

This invention relates to a read-out/write-in circuit for a semiconductor memory device.

2. Description of the Related Art

In recent years, electrically erasable and programmable nonvolatile memories or EEPROMs (Electrically Erasable Programmable Read Only Memories) are widely used in electronic devices such as mobile phones and digital still cameras. The EEPROM is provided with a memory cell having a floating gate and a control gate. It stores binary data or more than two-level data with electric charges stored in the floating gate, and the stored data is read out by sensing a difference in conductance between a source region and a drain region, which depends on the electric charges stored in the floating gate.

Memory cells in the EEPROM are classified into two types that are a stacked-gate type which has stacked layers of the floating gate and the control gate on a semiconductor substrate and a split-gate type in which both the floating gate and the control gate face a channel in a semiconductor substrate.

The control gate is connected to a word line in the split-gate type memory cell. When erasing the data, a high voltage is selectively applied to a word line selected by a decoder circuit. As a result, the data in the memory cell is erased by extracting the electric charges stored in the floating gate to the control gate. That is, when erasing the data in the memory cell, the high voltage is applied to the selected word line while a ground voltage is applied to non-selected word lines.

This kind of EEPROM is disclosed in U.S. Pat. Nos. 5,029,130, 5,045,488 and 5,067,108 and Japanese Patent Application Publication Nos. H11-274329, 2005-159336 and 2000-173278, for example.

However, forming EEPROM circuit as described above requires high withstand voltage transistors that tolerate the high voltage applied when erasing the data. If a large number of high voltage transistors are required, it causes a problem that a die size of the EEPROM becomes too big.

SUMMARY OF THE INVENTION

The semiconductor memory device that includes a memory cell comprising a control gate and a floating gate configured to accumulate electric charges. Data stored in the memory cell is erased by extracting the electric charges from the floating gate by applying an erasing voltage to the control gate so that the extracted electric charges are led to the control gate. The device also includes a word line connected to the control gate of the memory cell, a decoder circuit selecting the word line, a switching circuit outputting the erasing voltage to the word line when the word line is selected by the decoder circuit, and a first transistor connected between the switching circuit and the word line. The first transistor transfers the erasing voltage from the switching circuit to the word line selected by the decoder circuit. The device also includes a second transistor connected between the word line and the decoder circuit, and a control circuit that turns the second transistor off when the word line is selected by the decoder circuit so that the erasing voltage transferred to the word line is not applied to the decoder circuit and turns the second transistor on when the word line is not selected by the decoder circuit so that the decoder circuit provides the word line with a non-erasing voltage through the second transistor. The non-erasing voltage is lower than the erasing voltage.

DETAILED DESCRIPTION OF THE INVENTION

A semiconductor memory device according to an embodiment of this invention is hereinafter described referring to the figures.

Figure 1:
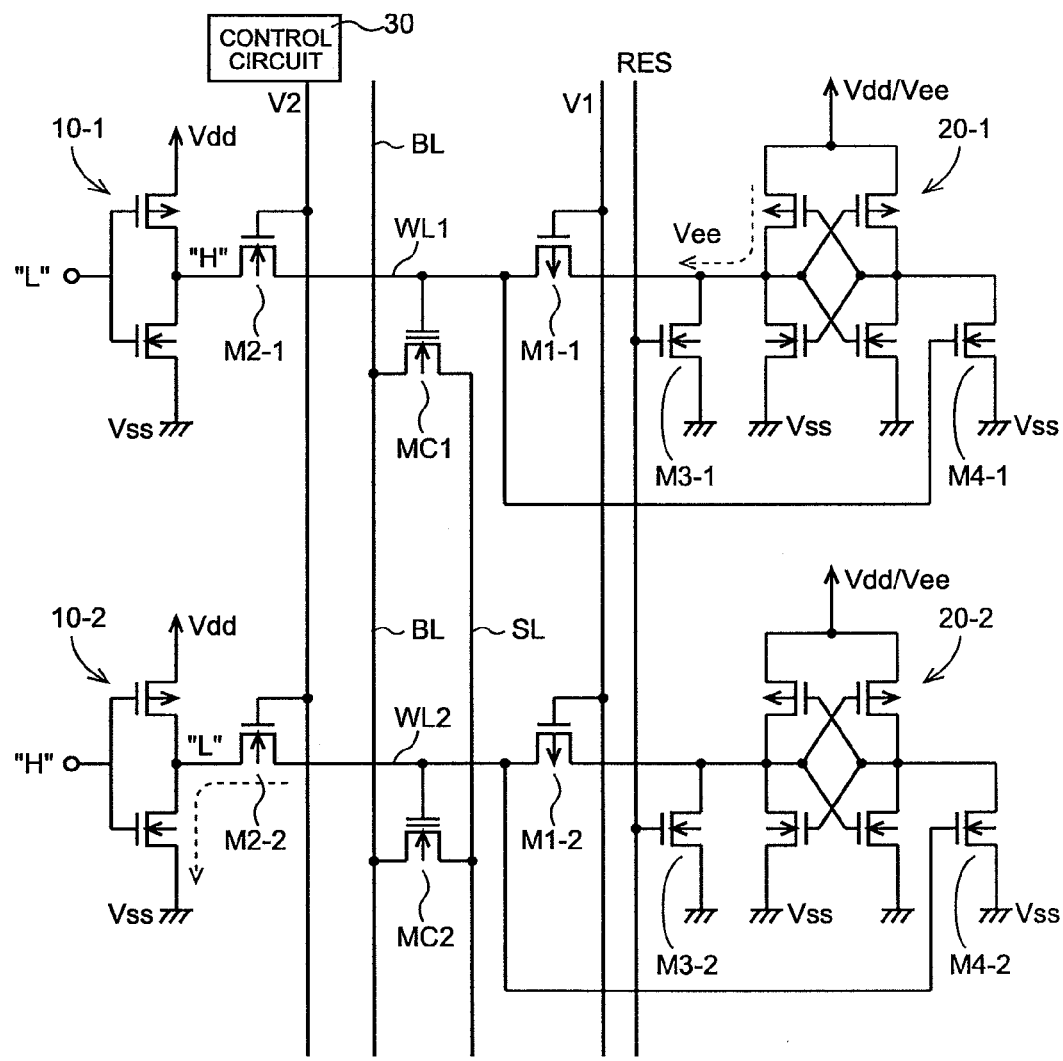
FIG. 1 is a circuit diagram showing a semiconductor memory device according to an embodiment of this invention.

A structure of the semiconductor memory device is described referring to FIG. 1. Structures of a first row and a second row of a memory cell array are shown in FIG. 1. There is provided a memory cell MC1 in the first row at a location corresponding to an intersection of a word line WL1 and a bit line BL. A control gate of the memory cell MC1 is connected to the word line WL1, its drain is connected to the bit line BL, and its source is connected to a source line SL. It is noted that a plurality of bit lines is provided so as to intersect the word lines WL and a plurality of memory cells is provided at locations corresponding to intersections of the bit lines and the word lines in an actual semiconductor memory device.

There is provided a decoder circuit 10-1 to select the word line WL1. The decoder circuit 10-1 is formed of a CMOS inverter that is provided with a power supply voltage Vdd and a ground voltage Vss. The decoder circuit 10-1 outputs a low level (=Vss) when an address signal inputted to it is at a high level, and outputs the high level (=Vdd) when the address signal inputted to it is at the low level. When the output of the decoder circuit 10-1 is at the low level, a voltage on the word line WL1 is at the low level (non-selected state). When the output of the decoder circuit 10-1 is at the high level, the voltage on the word line WL1 is at the high level (selected state).

A switching circuit 20-1 outputs a high voltage Vee (=erasing voltage) when the word line WL1 is selected by the decoder circuit 10-1. The switching circuit 20-1 has a latch circuit formed of two CMOS inverters with input terminals and output terminals cross-connected with each other, an N channel type reset transistor M3-1 connected between the ground and an output terminal of one of the CMOS inverters, that is an output terminal of the switching circuit 20-1, and an N channel type selection transistor M4-1 connected between the ground and an output terminal of another of the CMOS inverters.

A power supply of the latch circuit is initially provided with the power supply voltage Vdd, and is provided with the high voltage Vee when the data stored in the memory cell is to be erased. A magnitude relation among the high voltage Vee, the power supply voltage Vdd and the ground voltage Vss is, high voltage Vee>power supply voltage Vdd>ground voltage Vss.

A reset signal RES is applied to a gate of the reset transistor M3-1 that is turned on to reset the output of the switching circuit 20-1 to the low level when the reset signal RES is at the high level. The word line WL1 is connected to a gate of the selection transistor M4-1 that is turned on to invert the reset state of the latch circuit so that the high voltage Vee is outputted from the switching circuit 20-1 when the voltage on the word line WL1 is at the high level (selected state).

A first transistor M1-1 of P channel type is connected between the switching circuit 20-1 and the word line WL1. A control signal V1 is applied to a gate of the first transistor M1-1 that is turned on to transfer the high voltage Vee outputted from the switching circuit 20-1 to the word line WL1 that is selected by the decoder circuit 10-1 when the control signal V1 is at the low level. The control signal V1 is at the low level during an erasing operation of the data stored in the memory cell MC1.

A second transistor M2-1 of N channel type is connected between the word line WL1 and the decoder circuit 10-1. A control signal V2 from a control circuit 30 is applied to a gate of the second transistor M2-1.

When the decoder circuit 10-1 is in operation, the control signal V2 rises to a voltage higher than the power supply voltage Vdd by +α, that is, to a voltage (Vdd+α), and the second transistor M2-1 is turned on. When the second transistor M2-1 is turned on, the output (high or low) of the decoder circuit 10-1 is outputted to the word line WL1.

When the output of the decoder circuit 10-1 is at the high level, the word line WL1 is in the selected state and the switching circuit 20-1 is inverted from the reset state to the selected state. After that, the control signal V2 falls to a voltage lower than the power supply voltage by +β, that is, to a voltage (Vdd−β). When the power supply of the switching circuit 20-1 is raised from the power supply voltage Vdd to the high voltage Vee, the high voltage Vee is outputted through the first transistor M1-1 to the word line WL1. With this, the data in the memory cell MC1 is erased. The bit line BL and the source line SL are grounded during the erasing operation of the data stored in the memory cell MC1. At that time, because the output of the decoder circuit 10-1 keeps the high level (=Vdd) and the control signal V2 has fallen to (Vdd−β), the second transistor is turned off although the voltage on the word line WL1 rises to the high voltage Vee. Thus, the high voltage Vee is not applied to the decoder circuit 10-1. Because the high voltage Vee is not applied to the decoder circuit 10-1, there is no need to use the high withstand voltage transistor in forming the decoder circuit 10-1.

When the output of the decoder circuit 10-1 is at the low level, the word line WL1 is in the non-selected state, and the high voltage Vee from the switching circuit 20-1 is not outputted to the word line WL1. Instead, the word line WL1 is provided with the ground voltage Vss (=non-erasing voltage) from the decoder circuit 10-1 through the second transistor M2-1. As a result, the data in the memory cell MC1 is not erased. Although the control signal V2 falls to the voltage (Vdd−β), if the voltage (Vdd−β) is higher than a threshold voltage of the second transistor M2-1, the second transistor M2-1 is in ON state, albeit with a high resistance. It is preferable that the voltage (Vdd−β) is about 1 V. It is because the word line WL1 is provided with the ground voltage Vss (=non-erasing voltage) through the N channel type MOS transistor in the decoder circuit 10-1, which is turned on, and the second transistor M2-1.

The second row is structured just in the same way as the first row which is described above. That is, there is provided a memory cell MC2 at a location corresponding to an intersection of a word line WL2 and the bit line BL. There are also provided a first transistor M1-2, a second transistor M2-2, a decoder circuit 10-2 and a switching circuit 20-2.

In this embodiment, as described above, the first transistor M1-1 (or M1-2) may be made of a single P-channel type transistor only, since the word line WL1 (or WL2) is provided with the ground voltage Vss (=non-erasing voltage) from the decoder circuit 10-1 (or 10-2) when the word line WL1 (or WL2) is in the non-selected state.

Figure 2:
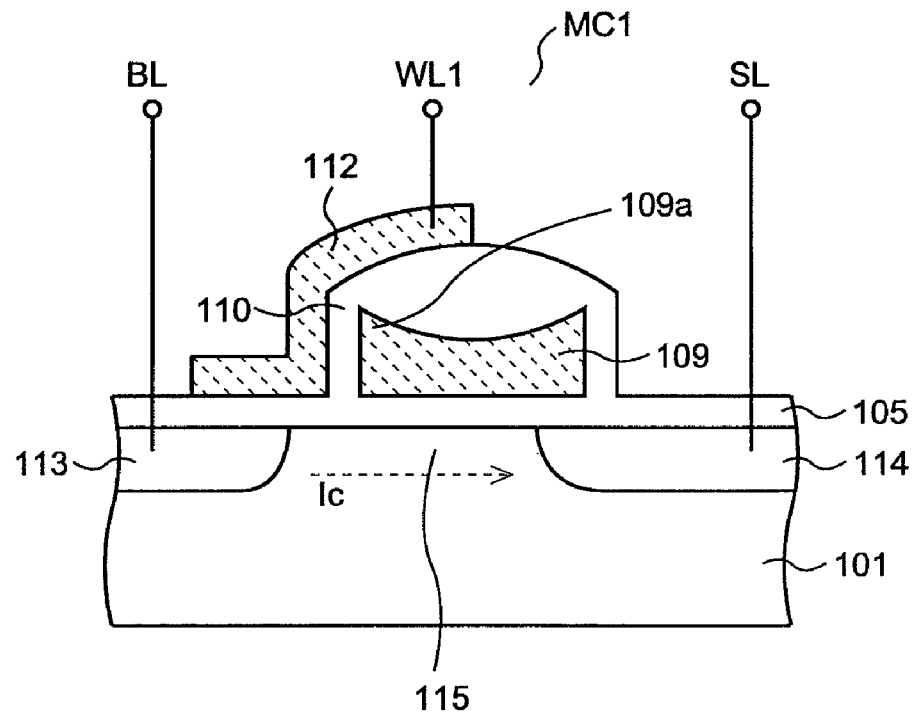
FIG. 2 is a cross-sectional view showing a split-gate type memory cell.

An example of a concrete structure of the memory cell MC1, which is the same as that of the memory cell MC2, will be explained referring to FIG. 2. The memory cell MC1 is a split-gate type memory cell in which a channel region 115 is formed between a drain region 113 and a source region 114 that are formed on a semiconductor substrate 101 to have a predetermined spacing. There is formed a floating gate 109 extending from above a portion of the channel region 115 to above a portion of the source region 114 through a gate insulation film 105. There is formed a control gate 112 covering a top surface and a side surface of the floating gate 109 through a tunnel insulation film 110 and extending to above a portion of the drain region 113.

The drain region 113 is connected to the corresponding bit line BL, the control gate is connected to the corresponding word line WL1, and the source region 114 is connected to the corresponding source line SL.

Operations of the split-gate type memory cell MC1 are described hereafter. When the data is to be written in, a voltage little higher than a threshold voltage of the memory cell MC1 (2 V, for example) is applied to the control gate 112 while a high voltage Vpp (12 V, for example) is applied to the source region 114 so that an electric current flows through the channel region 115 and hot electrons are injected into and accumulate in the floating gate 109.

When the data is to be erased, the high voltage Vee (15 V, for example) is applied from the word line WL1 to the control gate 112 while the drain region 113 and the source region 114 are grounded so that the electrons accumulated in the floating gate 109 are extracted to the control gate 112 as a Fowler-Nordheim tunneling current (hereafter referred to as a FN tunneling current). Since a sharp projection 109a is formed at an upper corner of the floating gate 109, electric field convergence is caused there to make it possible to induce the FN tunneling current at a reduced voltage.

When the data stored in the memory cell MC1 is to be read out, predetermined voltages are applied to the control gate 112 and the drain region 113 (3 V to the control gate 112 and 1 V to the drain region 113, for example). As a result, a cell current Ic of an amount corresponding to an amount of the electric charges of the accumulated electrons in the floating gate 109 flows between the source region 114 and the drain region 113. When the written-in data is "0", the cell current Ic is reduced because the threshold voltage of the memory cell MC1 is increased. When the written-in data is "1", the cell current Ic is increased because the threshold voltage of the memory cell MC1 is reduced.

The cell current Ic is converted to a data voltage Vdata by a preamplifier or the like. A read-out circuit judges whether the data stored in the memory cell MC1 is "0" or "1" by comparing the data voltage Vdata with a reference voltage Vref.

Figure 3:
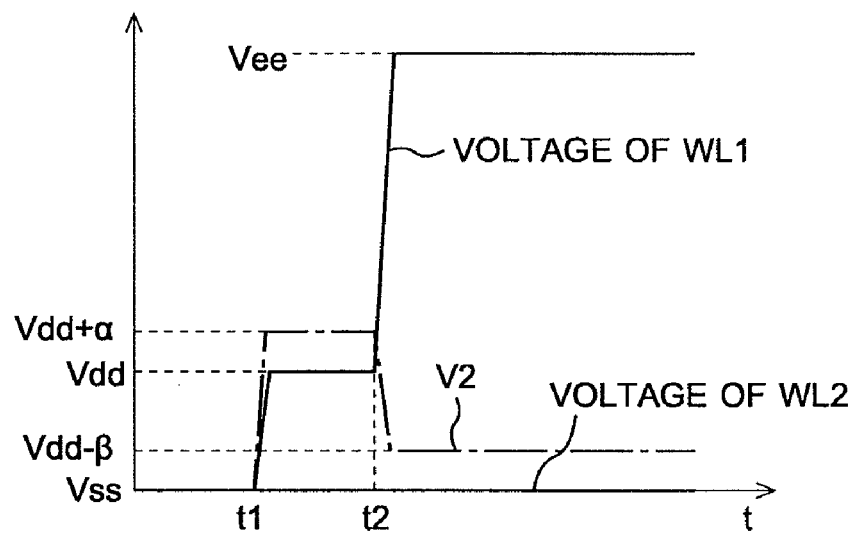
FIG. 3 is a timing chart showing an operation of the semiconductor memory device according to the embodiment of this invention.

An example of operations of the semiconductor memory device described above will be explained referring to FIGS. 1 and 3. First, an operation to erase the data stored in the memory cell MC1 will be explained. Now, the word line WL1 in the first row is in the selected state and the word line WL2 in the second row is in the non-selected state. That is, the address signal inputted to the decoder circuit 10-1 is at the low level (L=Vss) and the output of the decoder circuit 10-1 is at the high level (H=Vdd). The address signal inputted to the decoder circuit 10-2 is at the high level and the output of the decoder circuit 10-2 is at the low level. The control signal V1 is at the low level. The outputs of the switching circuits 20-1 and 20-2 are reset to the low level (=Vss) before entering into the erasing operation.

The control signal V2 from the control circuit 30 rises from the ground voltage Vss to (Vdd+α) at time t1. Then, in the first row, the second transistor M2-1 is turned on and the output voltage (high=Vdd) of the decoder circuit 10-1 is supplied to the word line WL1. When the word line WL1 turns to the high level, the selection transistor M4-1 in the switching circuit 20-1 is turned on. Then, the switching circuit 20-1 is turned to the selected state by inverting the reset state of the latch circuit. After that, the control signal V2 falls from (Vdd+α) to (Vdd−β) at time t2. As a result, the second transistor M2-1 is turned off. When the power supply of the switching circuit 20-1 is raised from the power supply voltage Vdd to the high voltage Vee, the high voltage Vee is supplied to the word line WL1 through the first transistor M1-1. With this, the data in the memory cell MC1 is erased.

In the second row, on the other hand, when the control signal V2 rises from the ground voltage Vss to (Vdd+α), the second transistor M2-2 is turned on and the output voltage (low) of the decoder circuit 10-2 is supplied to the word line WL2. Thus, the selection transistor M4-2 is turned off and the output of the switching circuit 20-2 remains at the low level. After that, although the control signal V2 falls from (Vdd+α) to (Vdd−β) at the time t2, the second transistor M2-2 keeps the ON state as described above. Therefore, the word line WL2 is provided with the ground voltage Vss (=non-erasing voltage) through the N channel type MOS transistor in the decoder circuit 10-2, which is turned on, and the second transistor M2-2. Therefore, the data in the memory cell MC2 is not erased.

Next, a read-out operation will be described. When the data in the memory cell MC1 connected to the word line WL1 is to be read out, the first transistors M1-1 and M1-2 are turned off by turning the control signal V1 to the high level. And by raising the control signal V2 to (Vdd+α), the word line WL1 is provided with the high level from the decoder circuit 10-1 through the second transistor M2-1. Then, a voltage is applied between the bit line BL and the source line SL to make the cell current Ic flow through the memory cell MC1. The cell current Ic is converted to a data voltage Vdata by a preamplifier or the like. The read-out circuit judges whether the data stored in the memory cell MC1 is "0" or "1" by comparing the data voltage Vdata with the reference voltage Vref.

During a write-in operation, the first transistors M1-1 and M1-2 are turned off by turning the control signal V1 to the high level. The high voltage Vpp (=write-in voltage) from the switching circuits 20-1 and 20-2 is applied to the source line SL through a switch (not shown).

Figure 4:
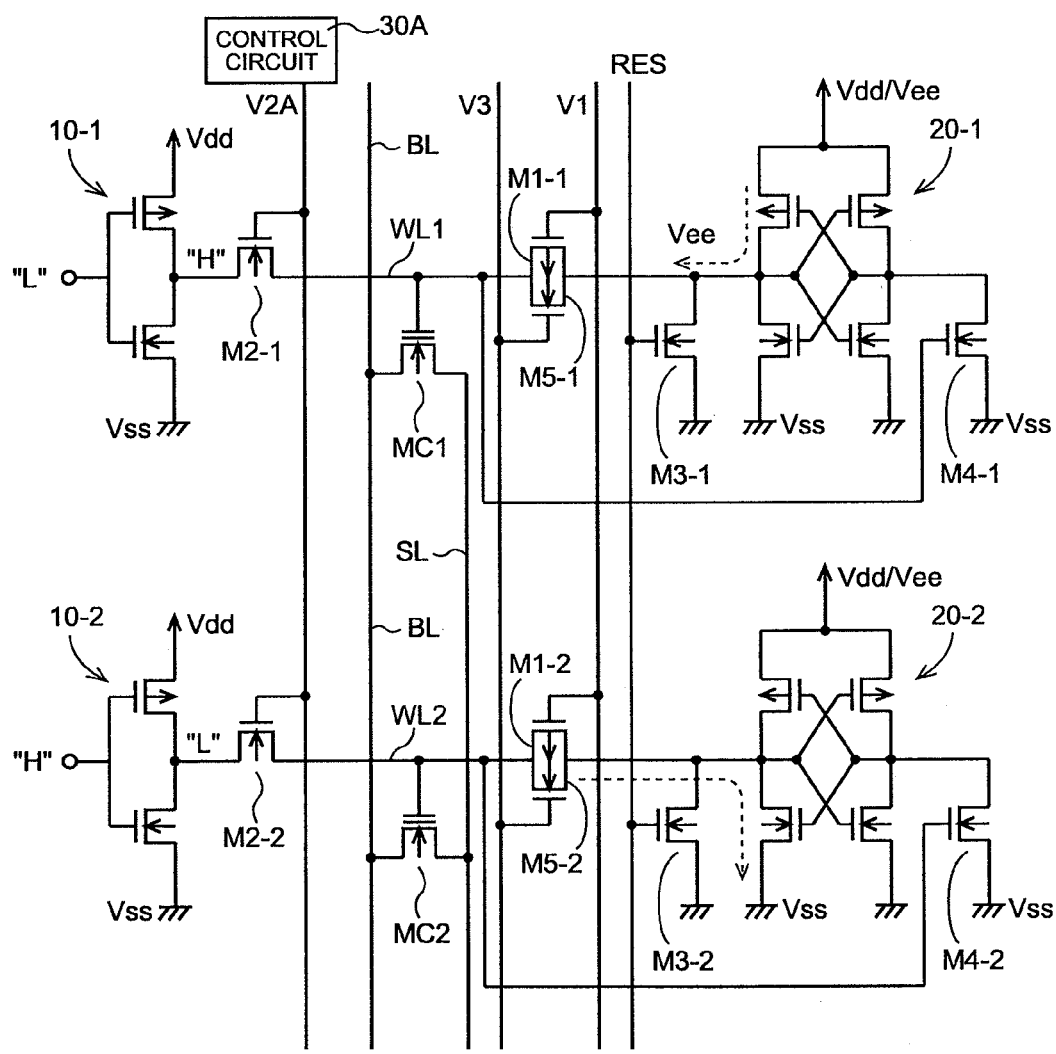
FIG. 4 is a circuit diagram of a semiconductor memory device according to a reference example.
Figure 5:
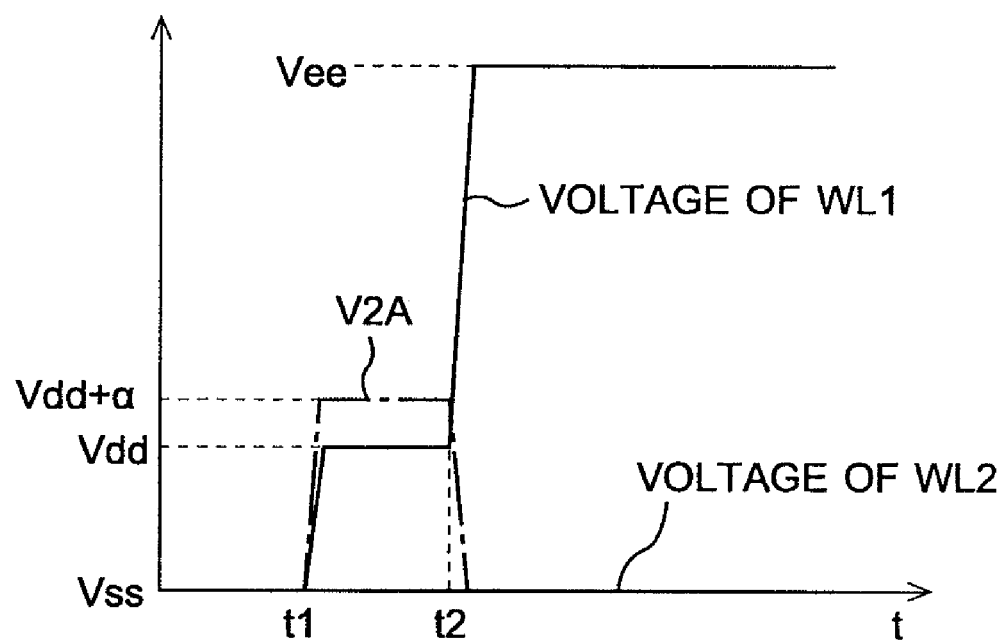
FIG. 5 is a timing chart showing an operation of the semiconductor memory device according to the reference example.

A semiconductor memory device according to a reference example is hereafter explained referring to FIGS. 4 and 5. The semiconductor memory device according to the reference example differs from the semiconductor memory device according to the embodiment described above in that a non-selected word line is provided with the ground voltage Vss (=non-erasing voltage) using the output of the switching circuit 20-1 or 20-2 when erasing the data. In order to do that, it is required to provide each of N channel type high withstand voltage transistors M5-1, M5-2 in parallel to each of the P channel type first transistors M1-1 and M1-2, respectively.

That is because transferring the ground voltage Vss to the word line is not possible with the P channel type first transistor alone and requires using the N channel type transistor. Each of the N channel type transistors is required to be of high withstand voltage because the high voltage from the switching circuit 20-1 or 20-2 is applied to it when the corresponding word line is selected. A control signal V3 is applied to a gate of each of the N channel type transistors M5-1 and M5-2. When erasing the data, the N channel type transistors M5-1 and M5-2 as well as the first transistors M1-1 and M1-2 are in the ON state, since the control signal V3 is at the high level.

The second transistors M2-1 and M2-2 are controlled by a control signal V2A from a control circuit 30A. The control signal V2A differs from the control signal V2 in the embodiment.

Operations of the semiconductor memory device according to the reference example are explained hereafter. Now, the word line WL1 in the first row is in the selected state and the word line WL2 in the second row is in the non-selected state. That is, the address signal inputted to the decoder circuit 10-1 is at the low level (L=Vss) and the output of the decoder circuit 10-1 is at the high level (H=Vdd). The address signal inputted to the decoder circuit 10-2 is at the high level and the output of the decoder circuit 10-2 is at the low level. The control signal V1 is at the low level while the control signal V3 is at the high level. The outputs of the switching circuits 20-1 and 20-2 are reset to the low level before entering into the erasing operation.

The control signal V2A from the control circuit 30A rises from the ground voltage Vss to (Vdd+α) at the time t1. Then, the second transistor M2-1 is turned on and the output voltage (high=Vdd) of the decoder circuit 10-1 is supplied to the word line WL1. When the word line WL1 turns to the high level, the selection transistor M4-1 in the switching circuit 20-1 is turned on. Then, the switching circuit 20-1 is turned to the selected state by inverting the reset state of the latch circuit. After that, the control signal V2A falls from (Vdd+α) to Vss at the time t2. As a result, the second transistor M2-1 is turned off. When the power supply of the switching circuit 20-1 is raised from Vdd to the high voltage Vee, the high voltage Vee from the switching circuit 20-1 is supplied to the word line WL1 through the first transistor M1-1 and the N channel type transistor M5-1. With this, the data in the memory cell MC1 is erased.

In the second row, on the other hand, when the control signal V2A rises from the ground voltage Vss to (Vdd+α), the second transistor M2-2 is turned on and the output voltage (low) of the decoder circuit 10-2 is supplied to the word line WL2. Thus, the selection transistor M4-2 is turned off and the output of the switching circuit 20-2 remains at the low level. Therefore, the ground voltage Vss that is the output of the switching circuit 20-2 is supplied to the word line WL2 through the N channel type transistor M5-2. After that, when the control signal V2A falls from (Vdd+α) to Vss at the time t2, the second transistor M2-2 is turned off.

Although the data in the memory cell MC1 connected to the selected word line WL1 can be erased as described above in the semiconductor memory device according to the reference example, there is a need to provide the N channel type high withstand voltage transistors M5-1 and M5-2 which cause a problem of making the die size larger than that of the semiconductor memory device according to the embodiment of this invention.

With the semiconductor memory device according to the embodiment of this invention, the data in the memory cell connected to the selected word line can be erased while the increase in the die size is suppressed by reducing the number of high withstand voltage transistors.

What is claimed is:

1. A semiconductor memory device comprising:
a memory cell comprising a control gate and a floating gate configured to accumulate electric charges, data stored in the memory cell being erased by extracting the electric charges from the floating gate by applying an erasing voltage to the control gate so that the extracted electric charges are led to the control gate;
a word line connected to the control gate of the memory cell;
a decoder circuit selecting the word line;
a switching circuit outputting the erasing voltage to the word line when the word line is selected by the decoder circuit;
a first transistor connected between the switching circuit and the word line, the first transistor transferring the erasing voltage from the switching circuit to the word line selected by the decoder circuit;
a second transistor connected between the word line and the decoder circuit; and
a control circuit that turns the second transistor off when the word line is selected by the decoder circuit so that the erasing voltage transferred to the word line is not applied to the decoder circuit and turns the second transistor on when the word line is not selected by the decoder circuit so that the decoder circuit provides the word line with a non-erasing voltage through the second transistor, the non-erasing voltage being lower than the erasing voltage.

2. The semiconductor memory device of claim 1, wherein the first and second transistors are high withstand voltage MOS transistors that withstand the erasing voltage.

3. The semiconductor memory device of claim 2, wherein the first transistor is a P channel type transistor and the second transistor is an N channel type transistor.

4. The semiconductor memory device of claim 3, wherein the erasing voltage is a positive voltage and the non-erasing voltage is a ground voltage.

* * * * *